United States Patent
Yu et al.

(10) Patent No.: US 8,519,482 B2
(45) Date of Patent: Aug. 27, 2013

(54) RELIABLE CONTACTS

(75) Inventors: Hong Yu, Singapore (SG); Huang Liu, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 15 days.

(21) Appl. No.: 13/246,879

(22) Filed: Sep. 28, 2011

(65) Prior Publication Data

US 2013/0075823 A1     Mar. 28, 2013

(51) Int. Cl.
    *H01L 21/70* (2006.01)

(52) U.S. Cl.
    USPC ........... 257/368; 257/532; 257/686; 257/774; 257/734; 257/773; 257/744; 438/107; 438/957; 438/109; 438/629; 438/637; 438/639; 438/667; 438/713; 438/602; 438/599

(58) Field of Classification Search
    USPC ................. 257/368, 532, 686, 774, 734, 773, 257/744; 438/107, 957, 109, 629, 637, 639–640, 667–668, 438/713, 618, 666, 602, 207, 599
    See application file for complete search history.

(56) References Cited

U.S. PATENT DOCUMENTS

| | | | | |
|---|---|---|---|---|
| 5,872,061 A * | 2/1999 | Lee et al. | | 438/705 |
| 5,965,035 A * | 10/1999 | Hung et al. | | 216/72 |
| 6,277,705 B1 * | 8/2001 | Lee | | 438/421 |
| 6,319,788 B1 * | 11/2001 | Gruening et al. | | 438/386 |
| 7,091,611 B2 * | 8/2006 | Ahn et al. | | 257/758 |
| 7,098,476 B2 * | 8/2006 | Babich et al. | | 257/62 |
| 7,265,373 B2 * | 9/2007 | Wang et al. | | 257/4 |
| 7,291,550 B2 * | 11/2007 | Kim | | 438/618 |
| 7,682,963 B2 * | 3/2010 | Chen et al. | | 438/619 |
| 7,732,317 B2 * | 6/2010 | Shin et al. | | 438/597 |
| 7,741,663 B2 * | 6/2010 | Hause et al. | | 257/288 |
| 8,013,238 B2 * | 9/2011 | Hockaday | | 136/250 |
| 8,111,541 B2 * | 2/2012 | Lai et al. | | 365/148 |
| 8,232,618 B2 * | 7/2012 | Breyta et al. | | 257/522 |
| 2004/0110350 A1 * | 6/2004 | Pang et al. | | 438/299 |
| 2004/0217443 A1 * | 11/2004 | Davies | | 257/531 |
| 2005/0051865 A1 * | 3/2005 | Lee et al. | | 257/506 |
| 2007/0190803 A1 * | 8/2007 | Singh et al. | | 438/758 |
| 2008/0054415 A1 * | 3/2008 | Frohberg et al. | | 257/642 |
| 2008/0061341 A1 * | 3/2008 | Lung | | 257/303 |
| 2008/0135824 A1 * | 6/2008 | Lai et al. | | 257/2 |
| 2008/0237714 A1 * | 10/2008 | Fazan | | 257/347 |
| 2008/0248649 A1 * | 10/2008 | Adetutu et al. | | 438/692 |
| 2008/0254617 A1 * | 10/2008 | Adetutu et al. | | 438/643 |
| 2009/0250762 A1 * | 10/2009 | Liu et al. | | 257/369 |
| 2010/0029062 A1 * | 2/2010 | Lung | | 438/466 |

(Continued)

*Primary Examiner* — Fernando L Toledo
*Assistant Examiner* — Mohammed Shamsuzzaman
(74) *Attorney, Agent, or Firm* — Horizon IP Pte. Ltd.

(57) ABSTRACT

A method for forming a device is disclosed. The method includes providing a substrate prepared with first and second contact regions and a dielectric layer over the contact region. First and second vias are formed in the dielectric layer. The first via is in communication with the first contact region and the second via is in communication with the second contact region. A buried void provides a communication path between the first and second vias. The vias and buried void are at least partially filled with a dielectric filler. The partially filled buried void blocks the communication path between the first and second vias created by the buried void. The dielectric filler in the vias is removed, leaving remaining dielectric filler in the buried void to block the communication path between the first and second vias and contact plugs are formed in the vias.

17 Claims, 14 Drawing Sheets

(56) References Cited

U.S. PATENT DOCUMENTS

| | | | |
|---|---|---|---|
| 2010/0038705 A1* | 2/2010 | Doris et al. | 257/327 |
| 2010/0230757 A1* | 9/2010 | Chen et al. | 257/368 |
| 2010/0244114 A1* | 9/2010 | Konno et al. | 257/314 |
| 2010/0261329 A1* | 10/2010 | Lung | 438/381 |
| 2011/0049713 A1* | 3/2011 | Frohberg et al. | 257/741 |
| 2011/0163367 A1* | 7/2011 | Kang et al. | 257/316 |
| 2011/0221004 A1* | 9/2011 | Kiehlbauch | 257/368 |
| 2011/0291170 A1* | 12/2011 | Chumakov et al. | 257/300 |
| 2011/0291196 A1* | 12/2011 | Wei et al. | 257/365 |
| 2012/0025318 A1* | 2/2012 | Richter et al. | 257/368 |
| 2012/0104512 A1* | 5/2012 | Horak et al. | 257/401 |
| 2012/0178227 A1* | 7/2012 | Cheng et al. | 438/218 |
| 2012/0199886 A1* | 8/2012 | Horak et al. | 257/288 |
| 2013/0001682 A1* | 1/2013 | Tang et al. | 257/331 |

\* cited by examiner

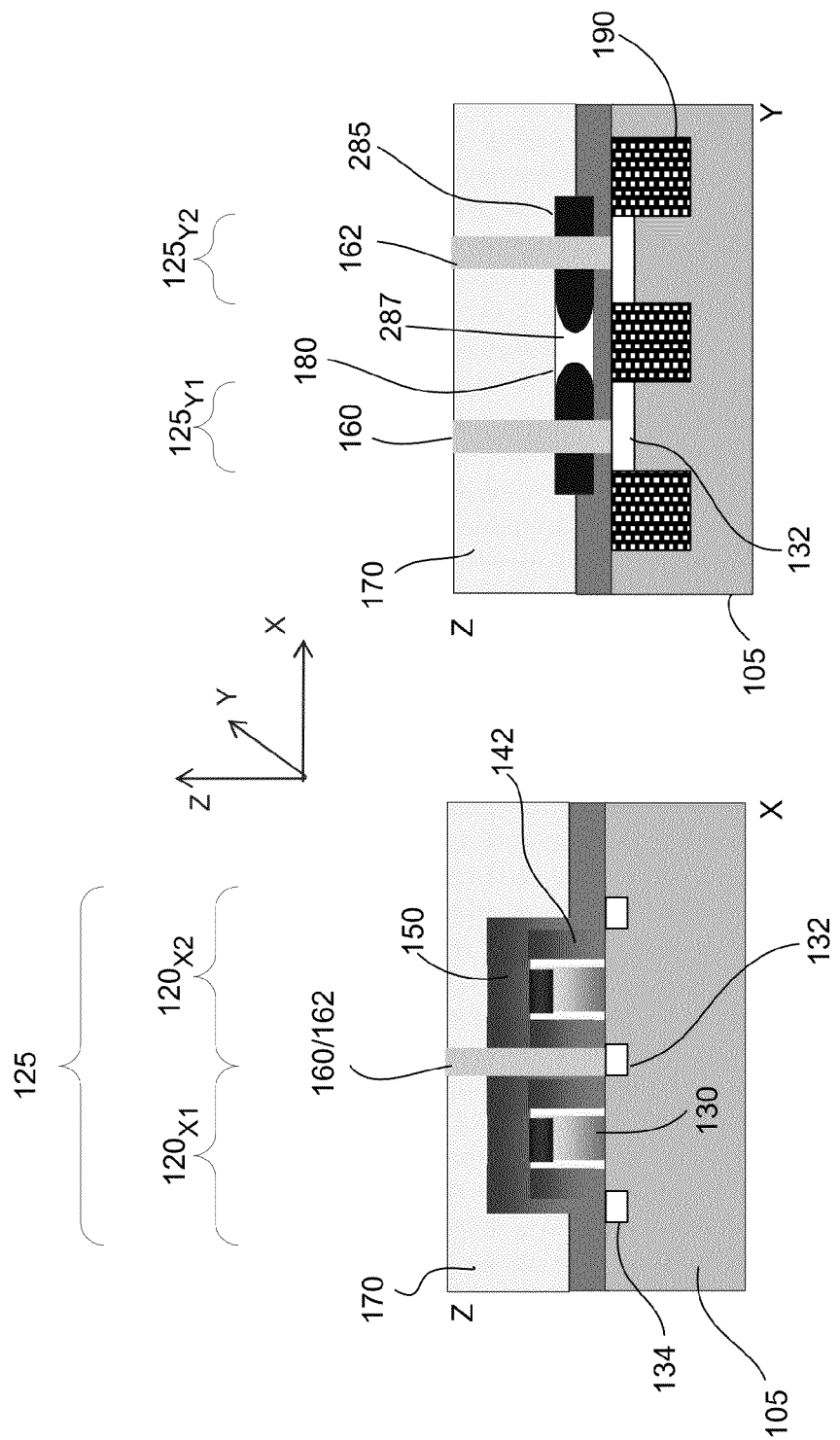

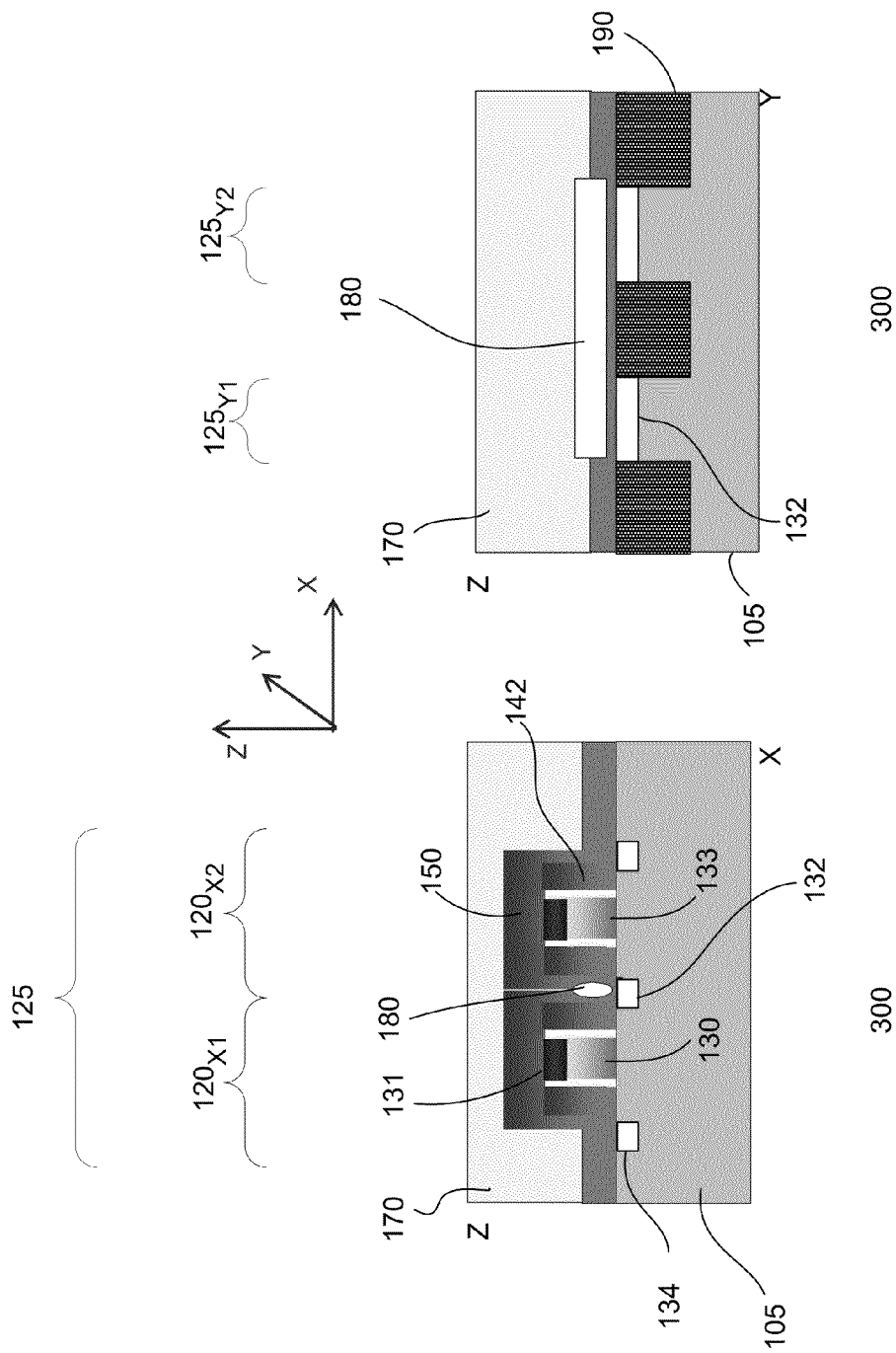
Fig. 3a₁
Fig. 3a₂

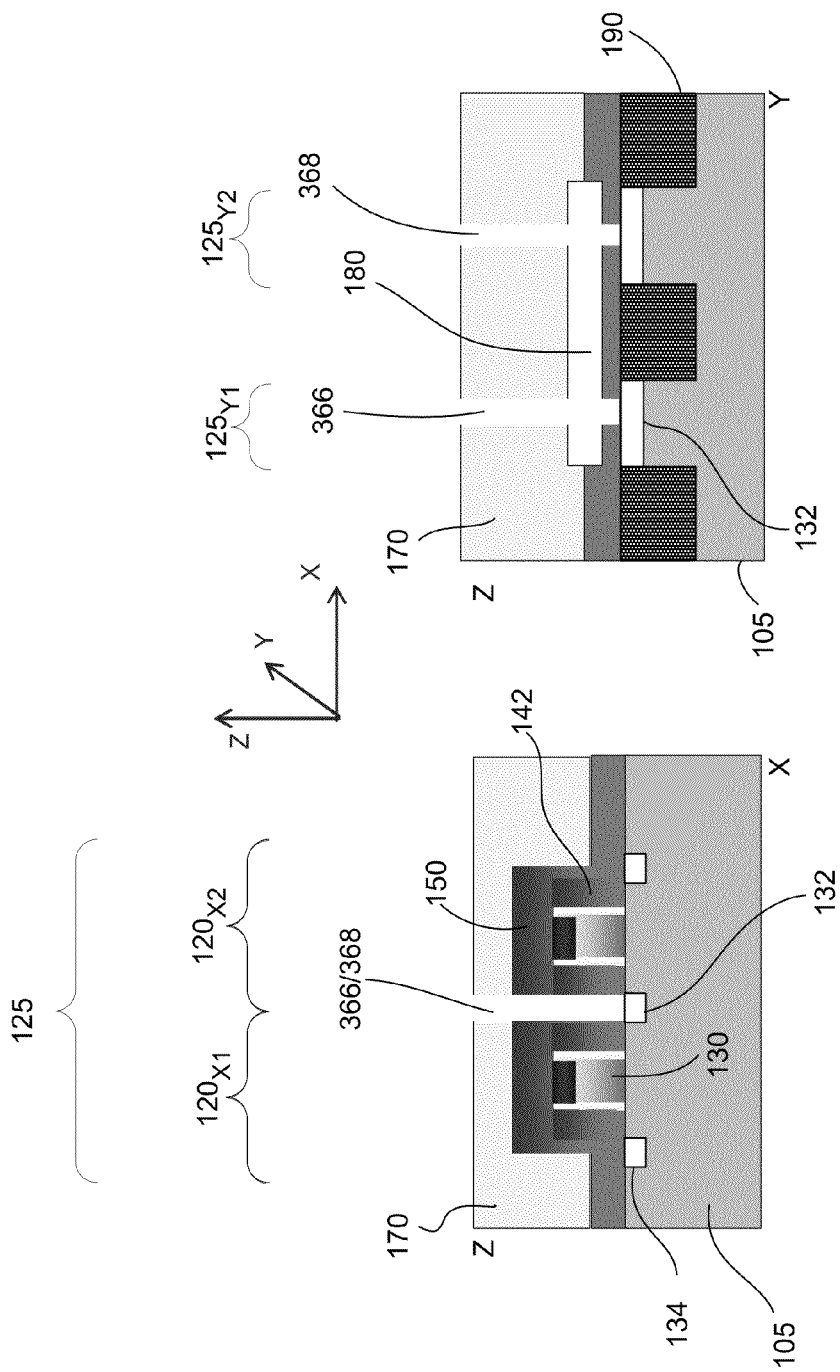

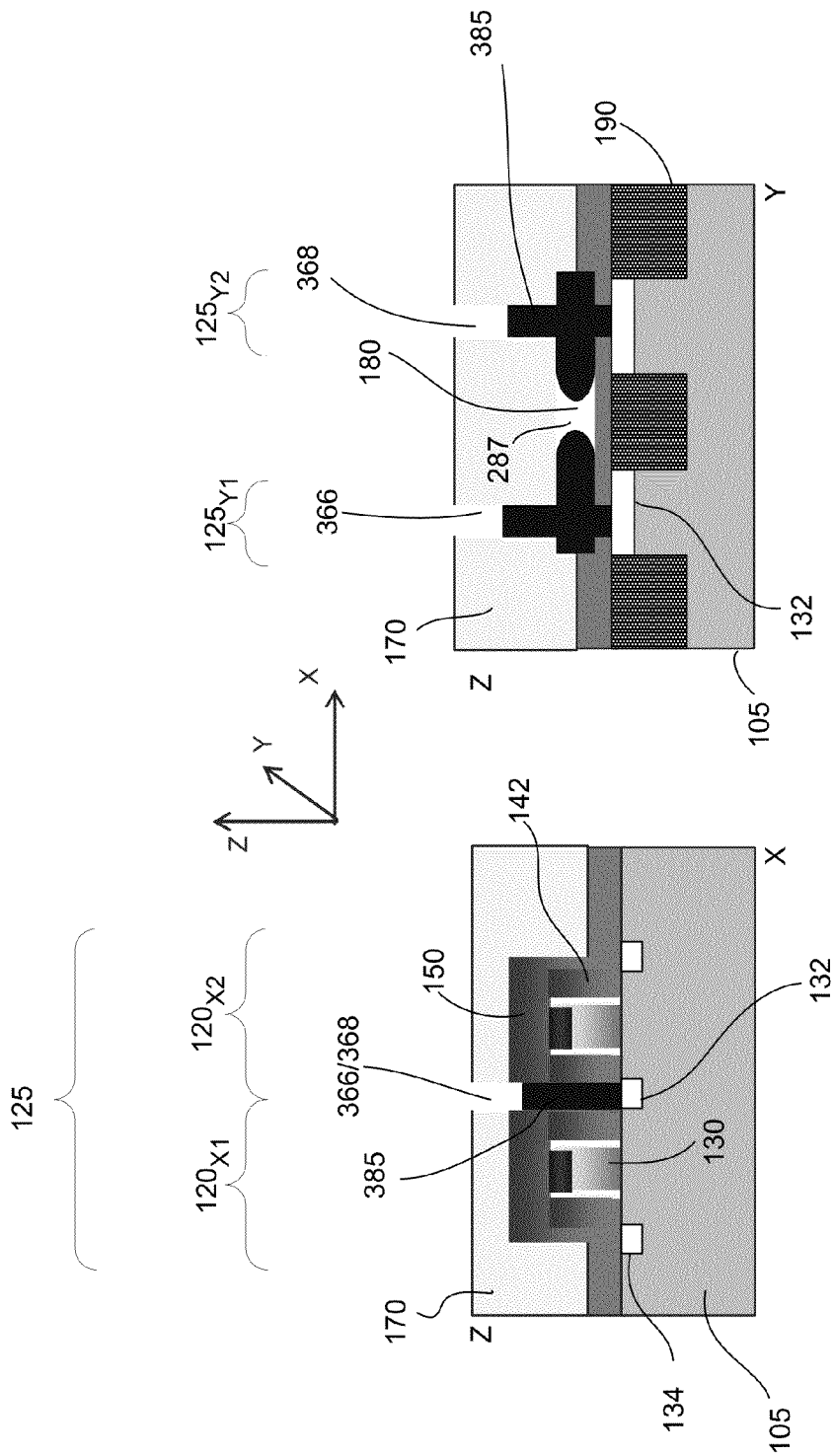

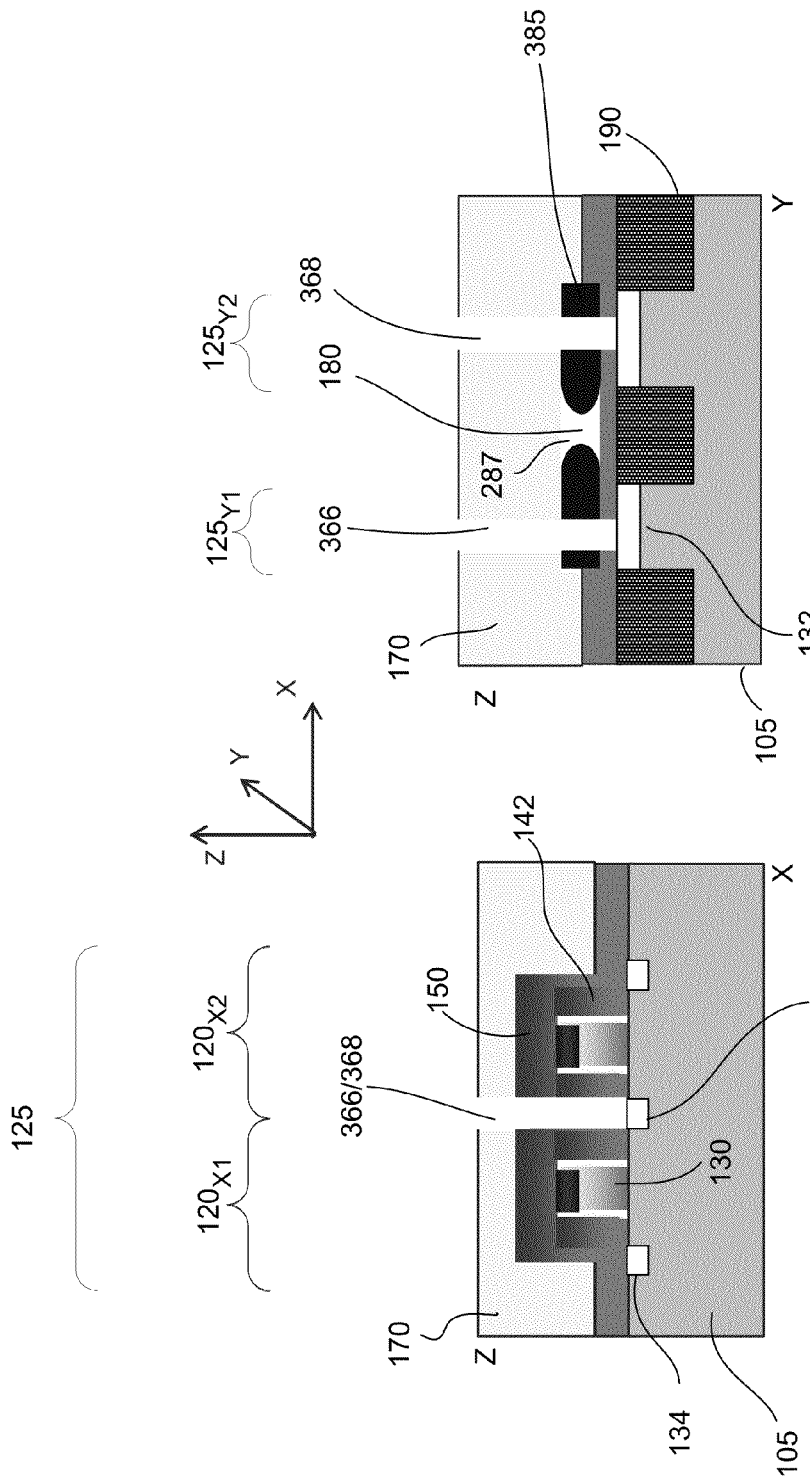

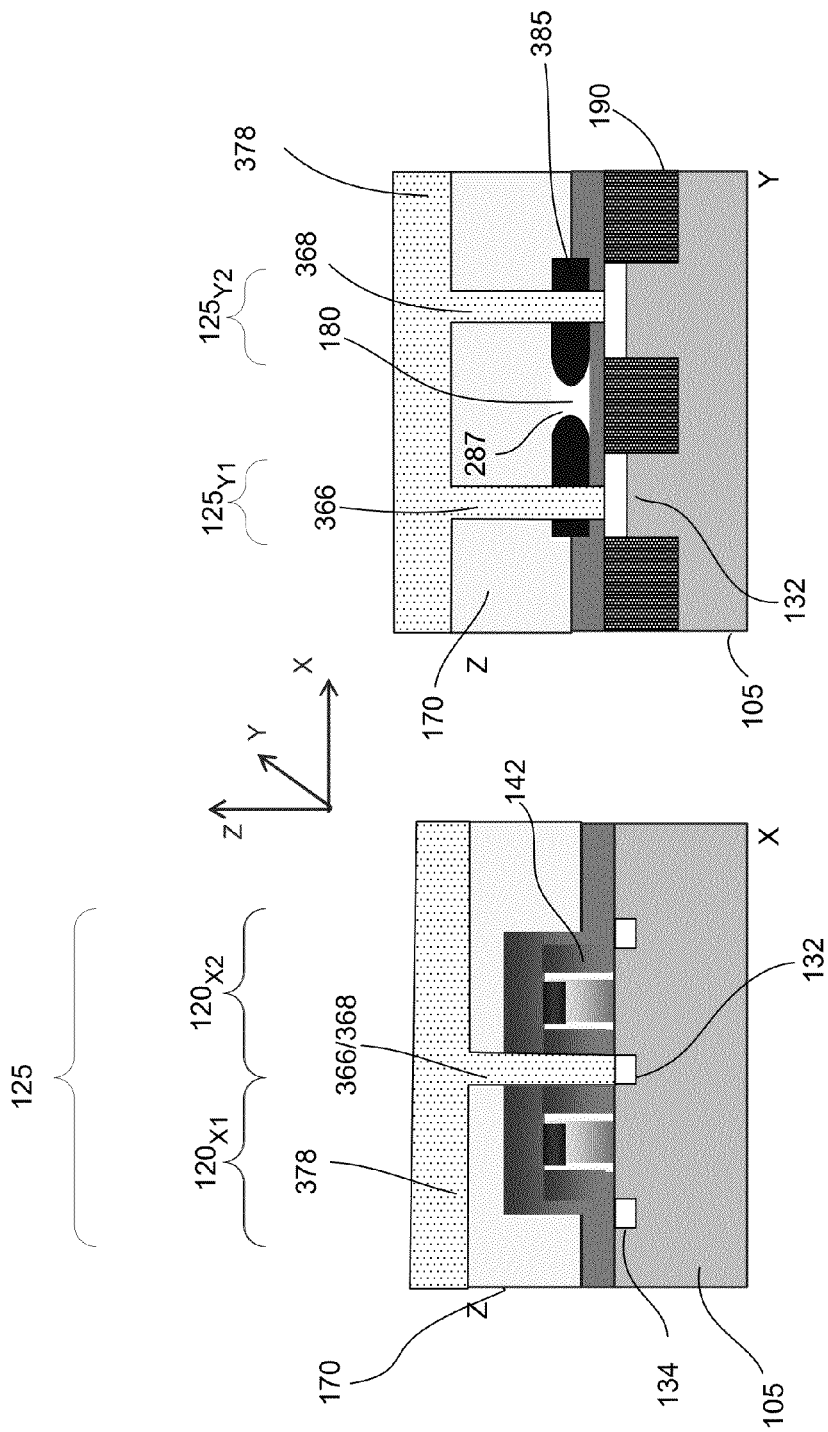

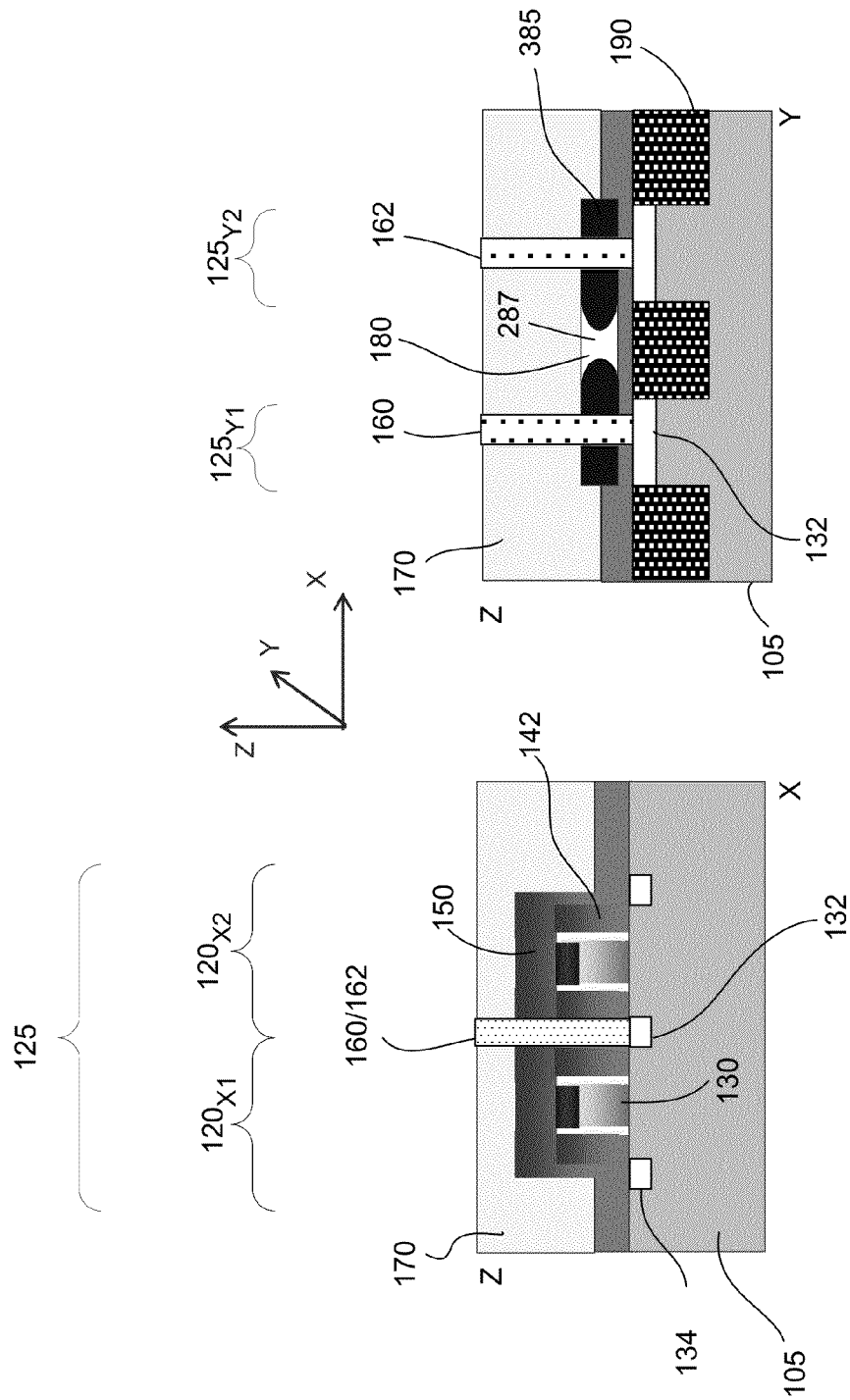
Fig. 3f₁
Fig. 3f₂

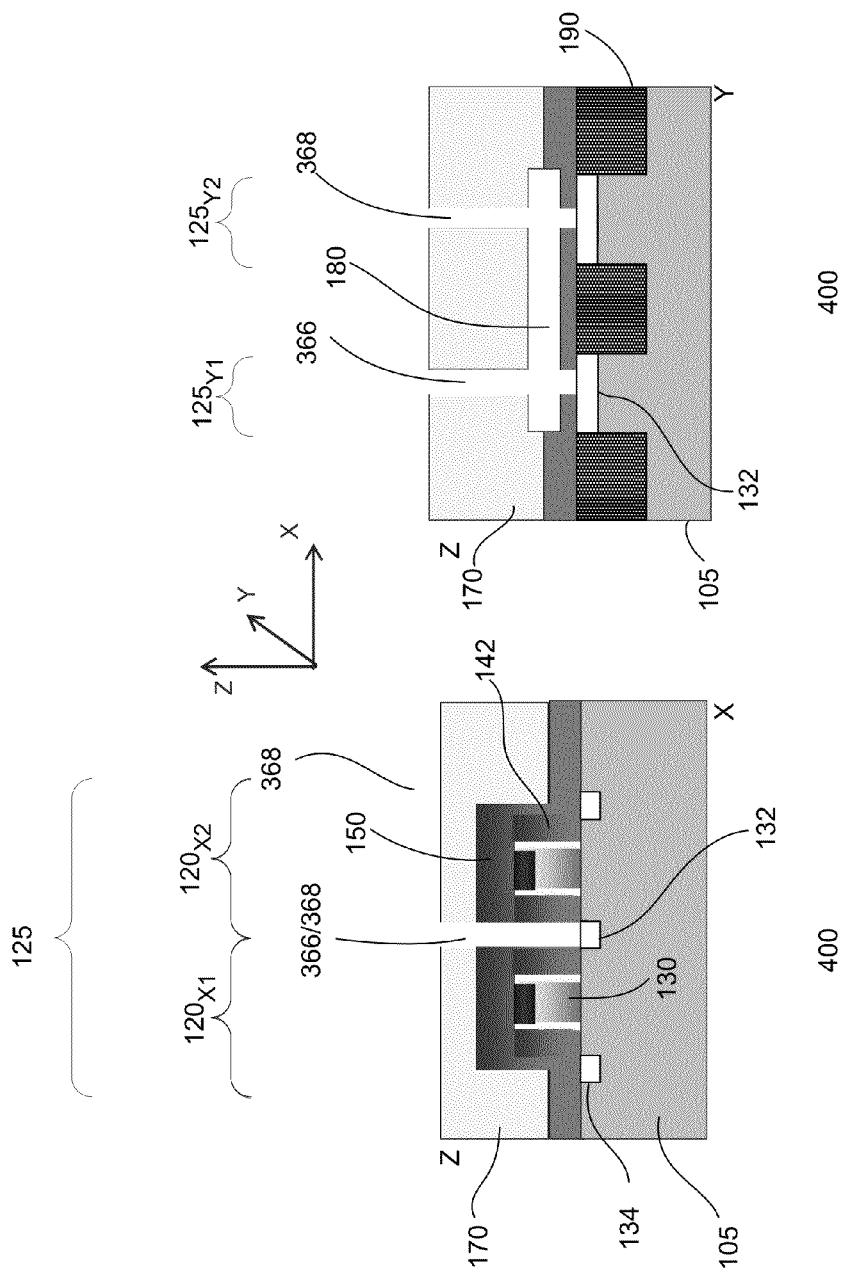

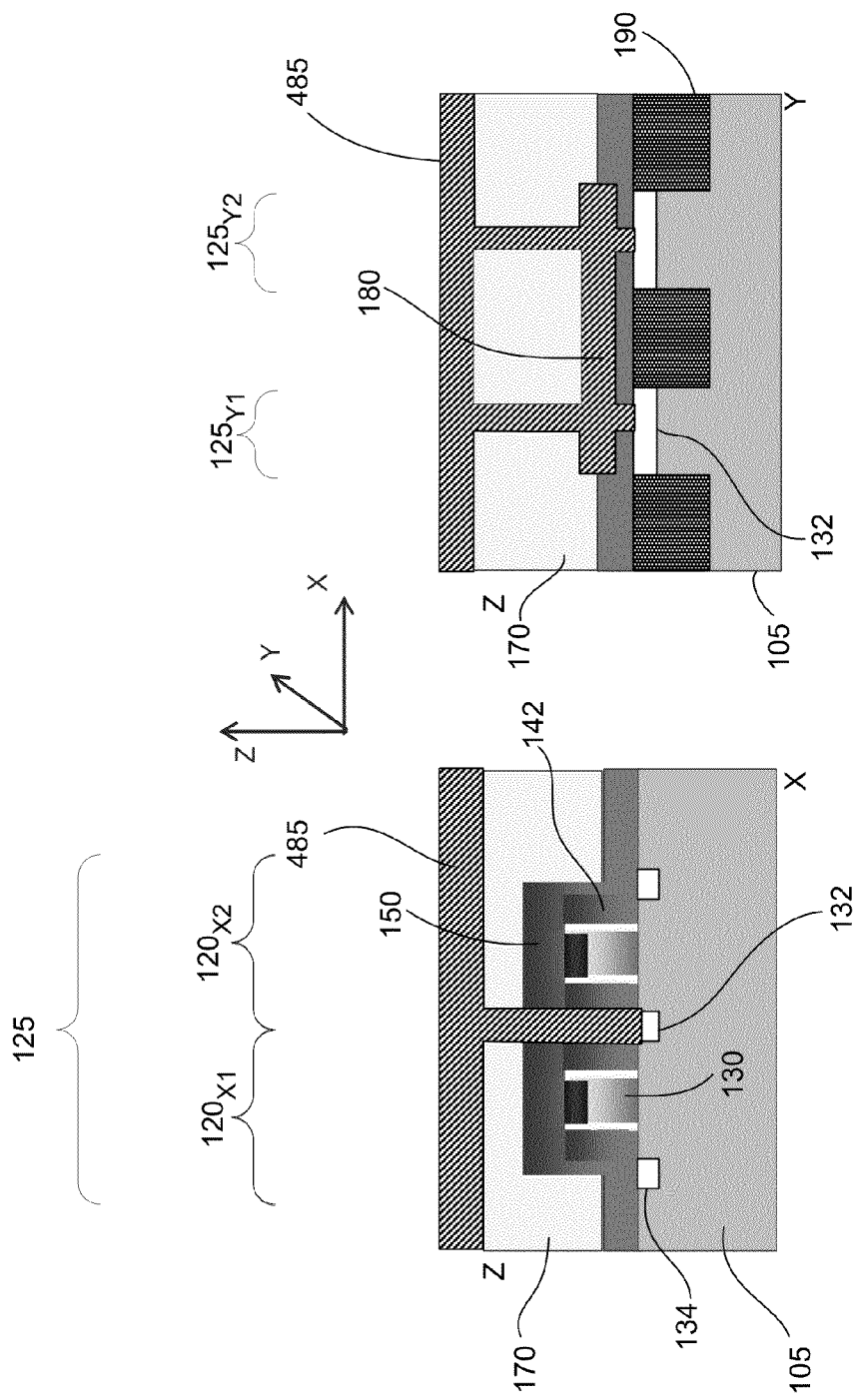

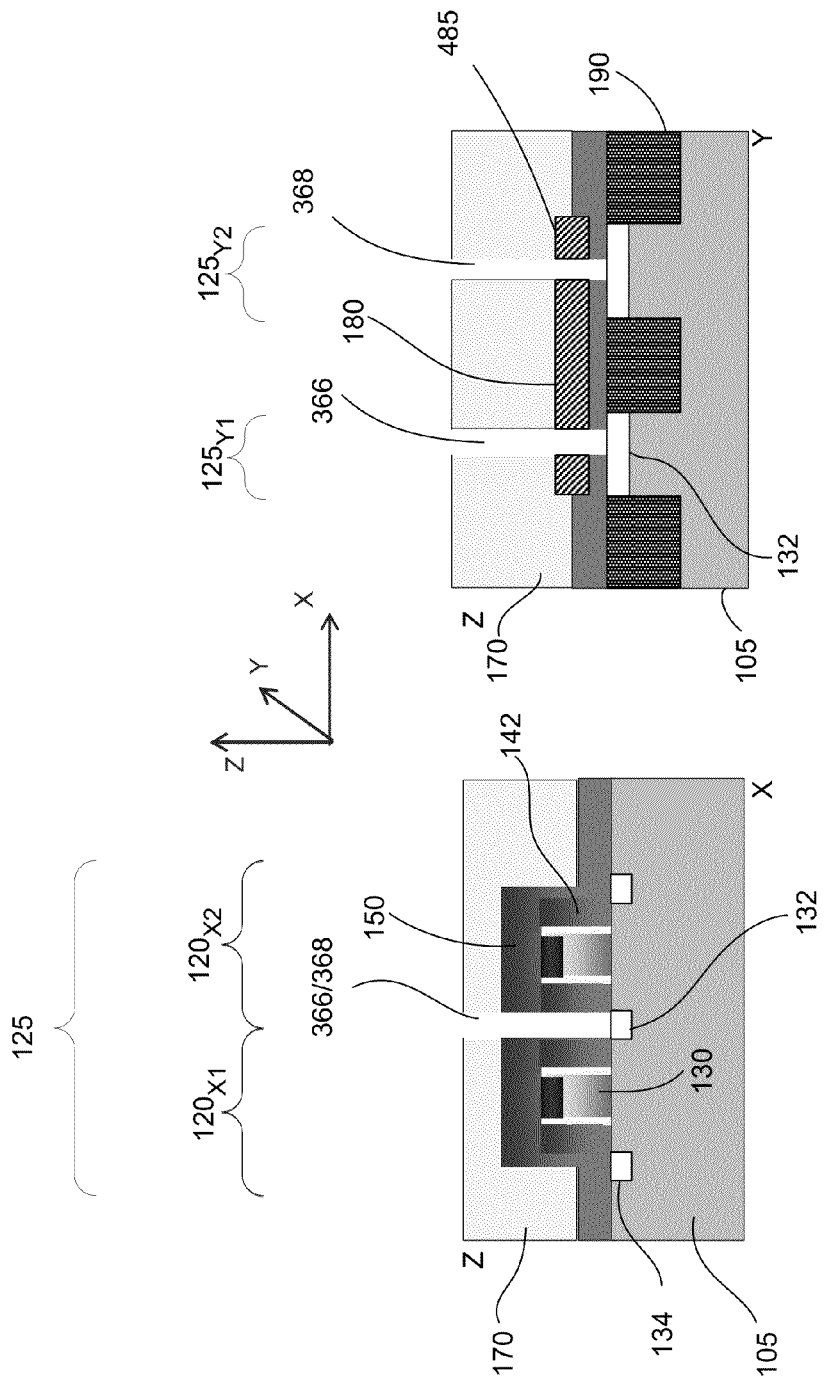

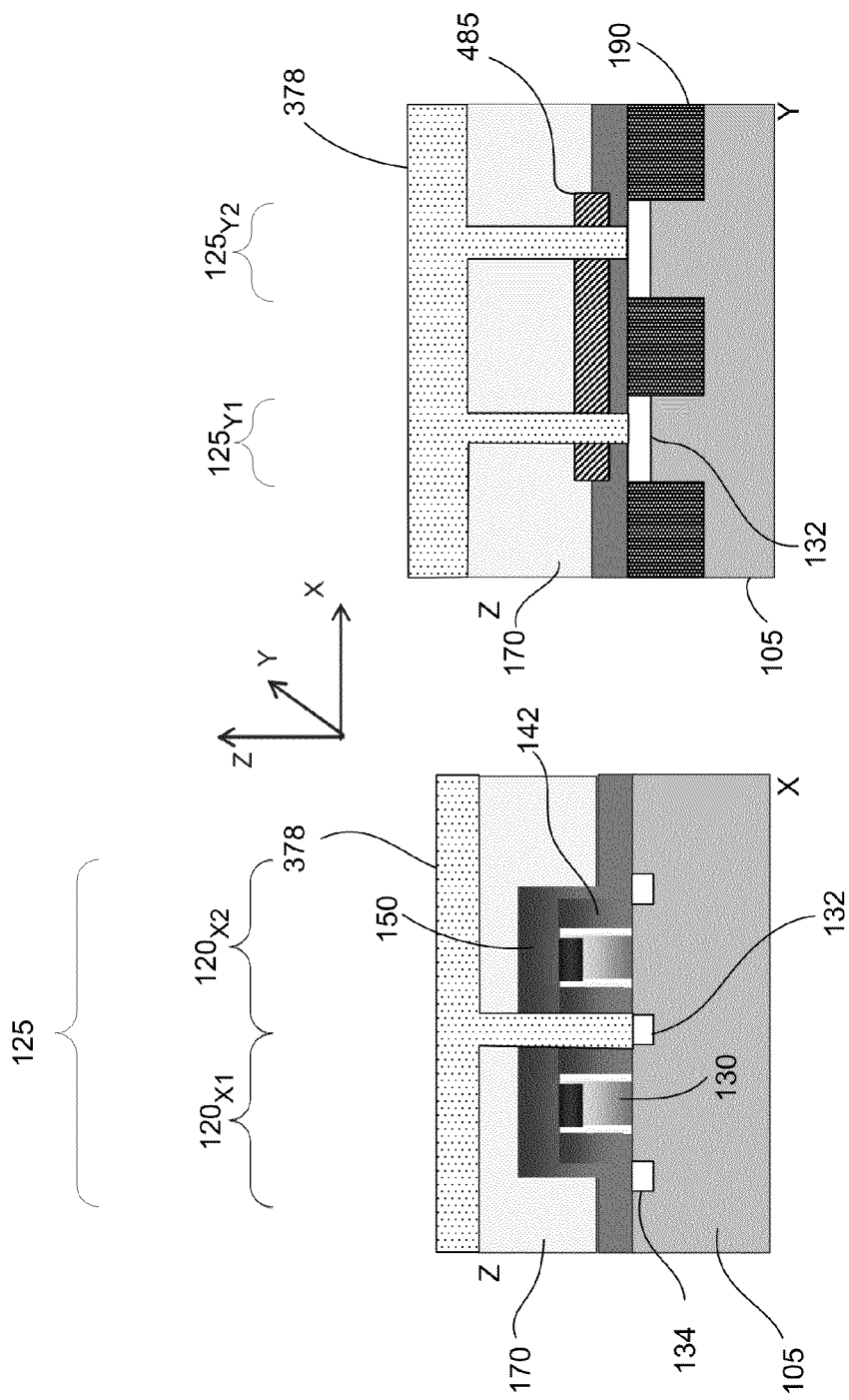

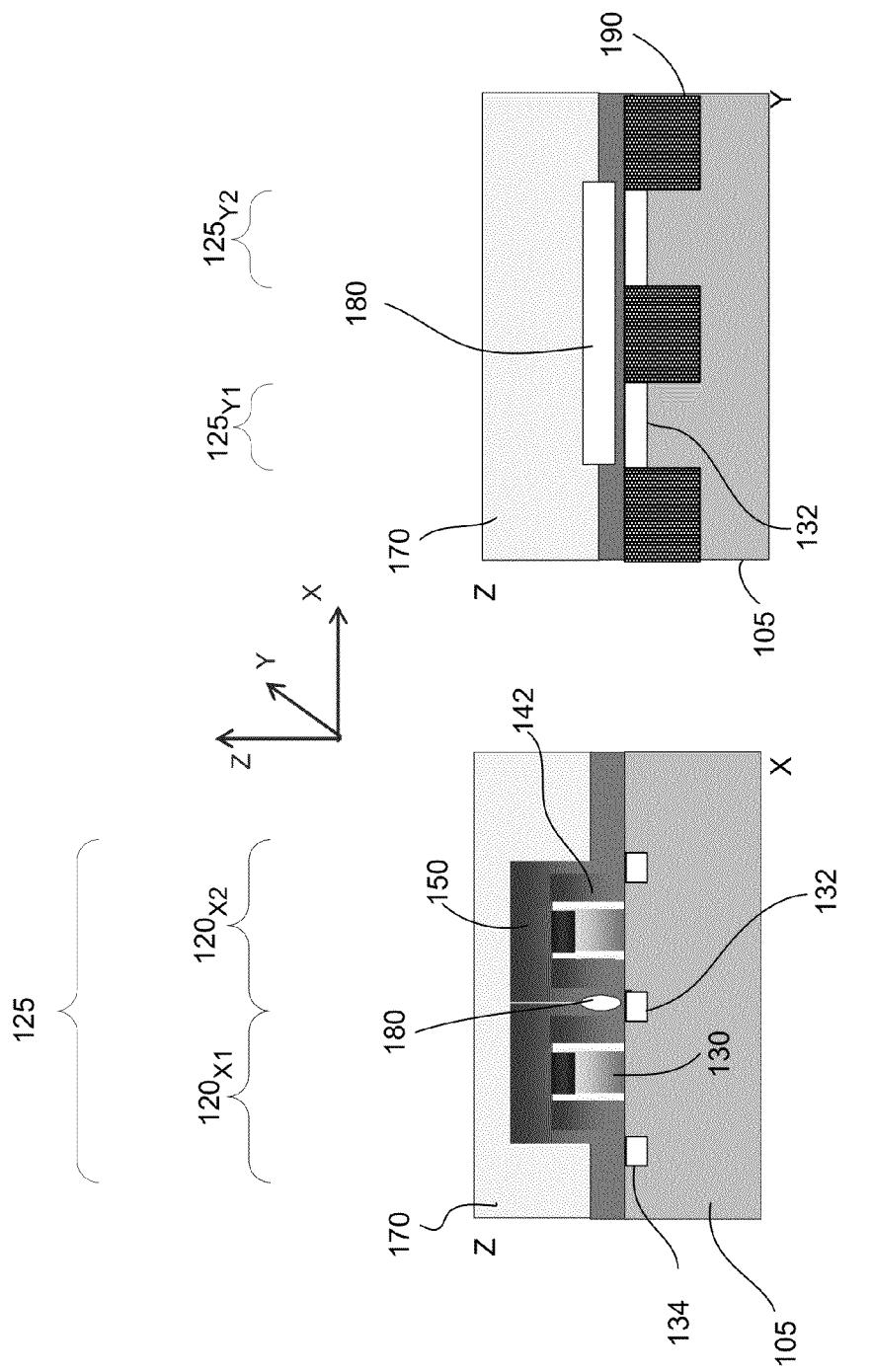

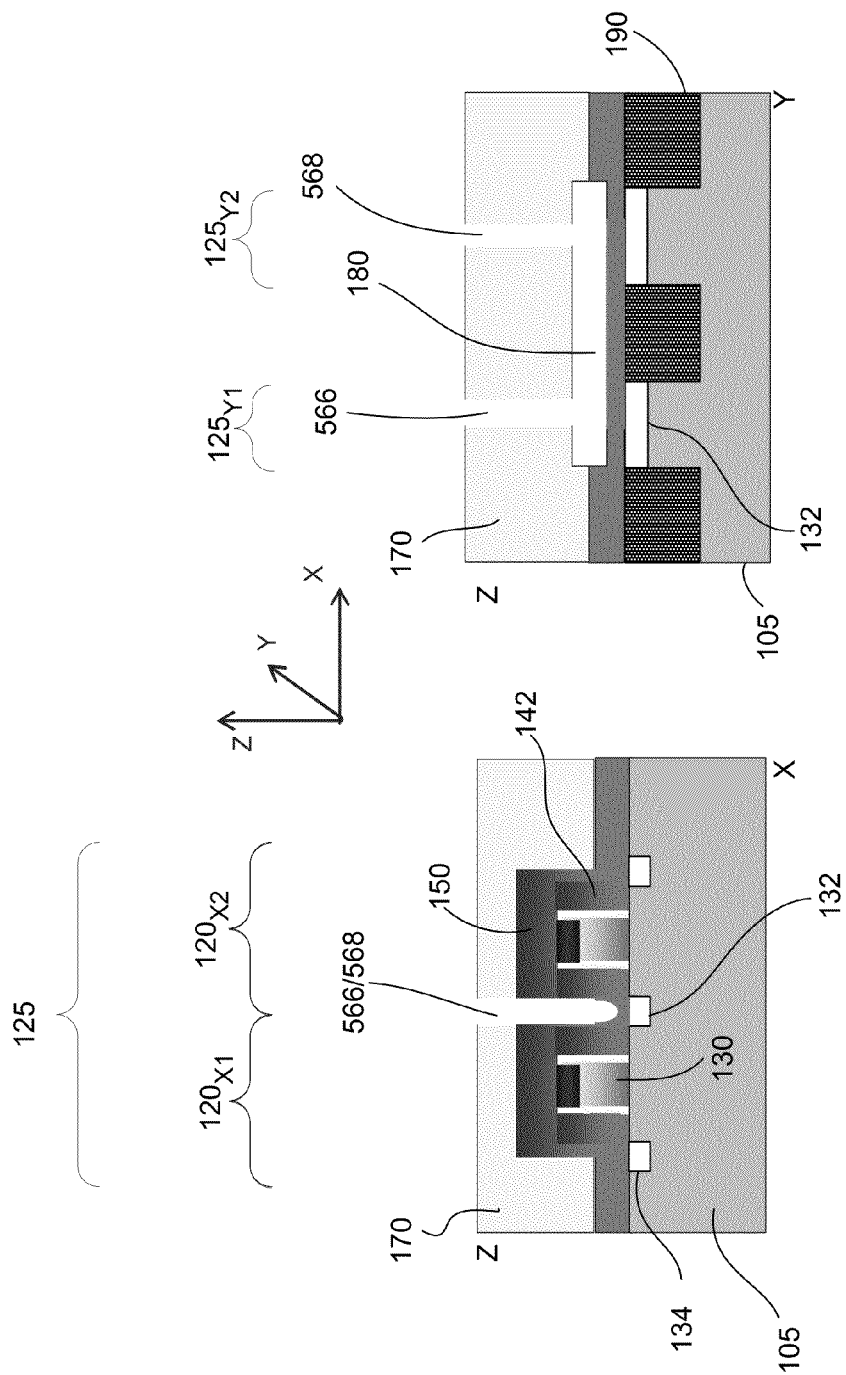

RELIABLE CONTACTS

BACKGROUND

The fabrication of integrated circuits (ICs) involves the formation of features on a substrate that make up circuit components, such as transistors, resistors and capacitors. The devices are interconnected, enabling the IC to perform the desired functions. Interconnections are formed by forming contacts and conductive lines in a dielectric layer using, for example, damascene techniques. A damascene structure, for example, includes a via or contact hole in a lower portion and a trench which is generally wider than the contact hole in an upper portion. The via serves as a contact to a device while the trench contains the conductive line for connecting the device to, for example, other devices.

As critical dimensions (CD) continue to shrink, time dependent dielectric breakdown (TDDB) has become an important reliability issue. For example, the destruction of the dielectric layer can cause interconnects to short, rendering the IC defective.

From the foregoing discussion, it is desirable to improve TDDB to increase IC reliability.

SUMMARY

Embodiments generally relate to devices, such as ICs. In one embodiment, a method for forming a device is disclosed. The method includes providing a substrate prepared with first and second contact regions and a dielectric layer over the contact region. First and second vias are formed in the dielectric layer. The first via is in communication with the first contact region and the second via is in communication with the second contact region. A buried void provides a communication path between the first and second vias. The vias and buried void are at least partially filled with a dielectric filler. The partially filled buried void blocks the communication path between the first and second vias created by the buried void. The dielectric filler in the vias is removed, leaving remaining dielectric filler in the buried void to block the communication path between the first and second vias and contact plugs are formed in the vias.

In another embodiment, a device is presented. The device includes a substrate having first and second contact regions and a dielectric layer over the contact regions. First and second vias and a buried void are disposed in the dielectric layer. The first via is in communication with the first contact region and the second via is in communication with the second contact region, and the buried void provides a communication path between the first and second vias. The buried void is at least partially filled with a dielectric filler. The partially filled buried void blocks the communication path between the first and second vias created by the buried void. The device further includes contact plugs. The contact plugs are disposed in the vias.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2a-b show different cross-sectional views of another embodiment of a portion of a device;

FIGS. 3a-f show different cross-sectional views of an embodiment of a process for forming a portion of a device;

FIGS. 4a-d show different cross-sectional views of another embodiment of a process for forming a portion of a device; and FIGS. 5a-b show different cross-sectional views of yet another embodiment of a process for forming a portion of a device.

DETAILED DESCRIPTION

Figures 1A, 1B:
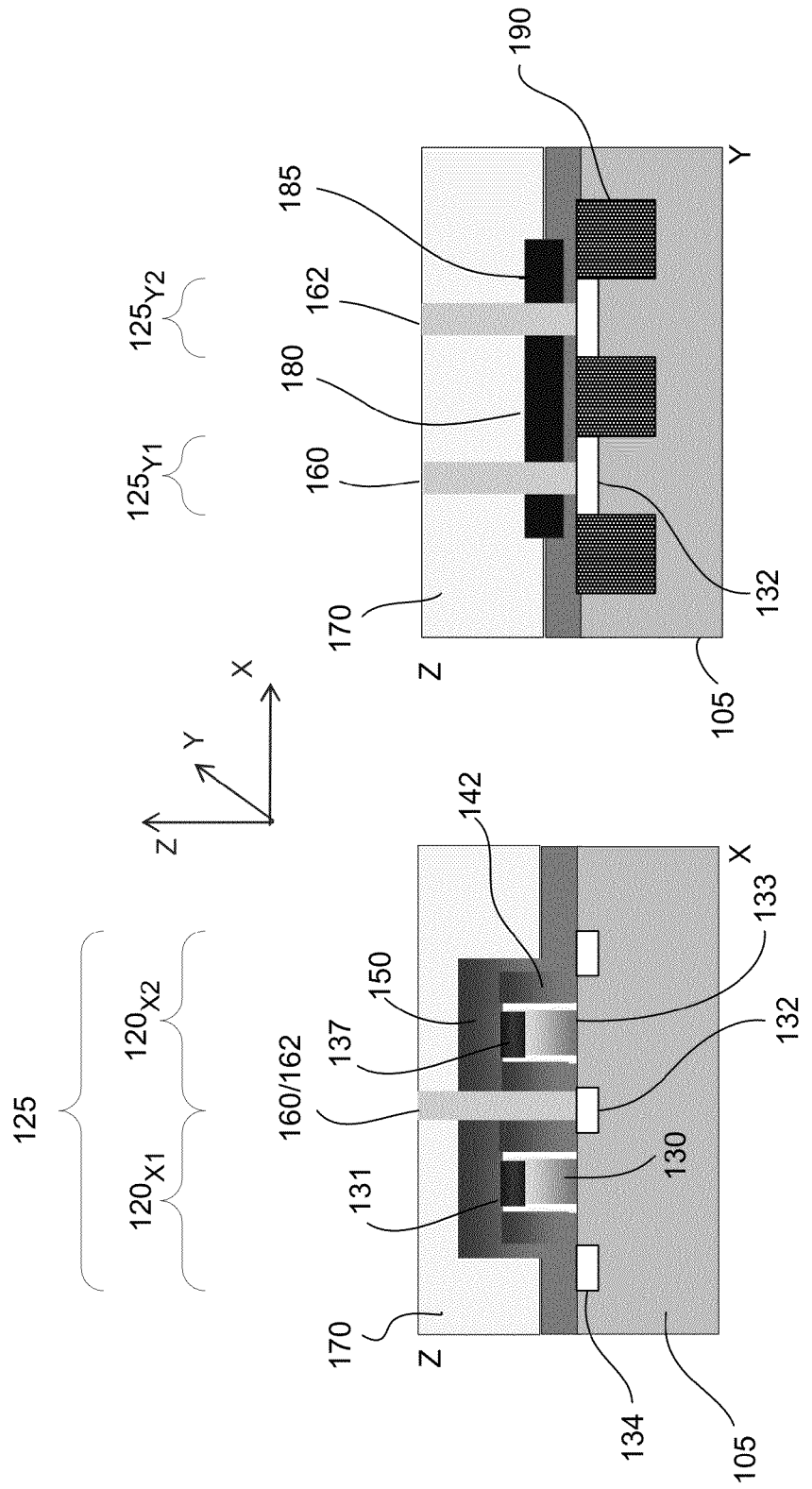
FIGS. 1a-b show different cross-sectional views of an embodiment of a portion of a device.

Embodiments generally relate to devices, such as ICs. Other types of devices may also be useful. More particularly, the present invention relates to interconnections and processes for forming such devices The devices can be any type of IC, for example dynamic or static random access memories, signal processors, or system-on-chip devices. The ICs can be incorporated into, for example, consumer electronic products, such as computers, cell phones, and personal digital assistants (PDAs).

FIGS. 1a-b show different cross-sectional views of an embodiment of a portion of a device 100. The cross-sectional views are simplified views of the device. The cross-sectional views are taken at orthogonal planes on the Z-axis. In one embodiment, FIG. 1a is a cross-sectional view along the X and Z axes (X-Z direction) while FIG. 1b is a cross-sectional view along the Y and Z axes (Y-Z direction). The device, for example, may be an integrated circuit (IC). Other types of devices may also be useful. As shown, the portion includes a substrate 105. Referring to FIGS. 1a-b, the substrate, for example, is a silicon substrate. Other types of substrates, such as silicon germanium, germanium, gallium arsenide, or crystal-on-insulator (COI) such as silicon-on-insulator (SOI), are also useful. The substrate maybe a doped substrate. For example, the substrate may be a lightly doped p-type substrate. Doping the substrate with other types of dopants or dopant concentrations may also be useful.

The substrate includes a device region with first and second adjacent transistors $120_{X1}$ and $120_{X2}$ along the X-Z direction. Although only two transistors are shown on the X-Z direction, it is understood that the device may include other number of transistors in each plane. The substrate may include other device regions. The device regions may be for other types of devices, including both p-type and n-type devices. For example, the IC may include logic regions in which logic devices are formed. Depending on the type of IC, the logic regions, for example, may include regions for different voltage devices. For example, the logic regions may include regions for high voltage (HV) devices, medium or intermediate voltage (IV) devices and low voltage (LV) devices. Other configurations of logic regions may also be useful. Additionally, other types of device regions may also be provided.

A transistor includes a gate 131 on the substrate. The gate for example, includes a gate electrode 130 over a gate dielectric 133. The gate dielectric, for example, may be silicon oxide while the gate electrode may be polysilicon. Other types of gate dielectrics and gate electrodes may also be useful. For example, the gate dielectric may be a high k gate dielectric and the gate electrode may be a metal gate electrode. Other gate configurations of gate layers of the gate may also be useful. For example, the gate may include layers for a NVM gate. Furthermore, it is understood that adjacent gates need not have the same composition.

A transistor also includes first and second source/drain (S/D) regions 132 and 134 disposed in the substrate adjacent to the gate. As shown, adjacent transistors share a common S/D region. In one embodiment, the adjacent transistors share a common first S/D region, forming a transistor pair 125. Sharing of a common second S/D region may also be useful. In the case wherein there are more than 2 adjacent transistors along the X-Z direction, different adjacent transistor pairs may share common first and second S/D regions. The S/D regions are doped regions having first polarity type dopants for first-type transistors. For example, n-type dopants are provided in the S/D regions for n-type transistors. Providing p-type dopants for p-type transistors may also be useful.

Salicide contacts 137 may be formed on the gate electrode of the gate and S/D regions. The salicide contacts, for example, may be nickel-based salicide contacts. Other types of metal salicide contacts may also be useful. The salicide contacts reduce contact resistance for contact regions of the transistor. In some embodiments, not all contact regions of the transistors may have salicide contacts. For example, salicide contacts may be provided for the S/D regions but not for the gate electrodes. Other configurations of salicide contacts for the transistors may also be useful.

A device well may be provided in the substrate. The device well includes second polarity type dopants. For example, a p-type device well may be provided for n-type transistors. In one embodiment, the device well may be a common device well. In some embodiments, the device well may be a multi-level device well which includes second and first polarity type dopants. For example, a second polarity type device well may encompass the S/D regions while a first polarity type device well encompasses the second polarity type well. Providing more than one device well is also useful and in the case of multiple device wells, isolation regions may be provided to isolate the device wells. Other configurations of device wells may also be useful.

Sidewalls of a gate may be provided with dielectric spacers 142. The dielectric spacers, for example, may be silicon oxide spacers. Other types of dielectric materials may also be useful. The spacers may be composite spacers. For example, the spacers may include an offset spacer and main spacer. The offset spacers may facilitate forming lightly doped S/D (LDD) regions while the main spacers facilitate forming heavily doped S/D regions. In some cases, the transistor may also include halo regions. Halo regions are second polarity doped regions abutting the S/D regions proximate to the gate.

A dielectric etch stop layer 150 is formed over the transistors. The etch stop layer, for example, is a silicon nitride etch stop layer. Other types of etch stop layers may also be useful. The etch stop layer should have a material which can be selectively removed from a dielectric layer 170 thereover. The etch stop layer facilitates in forming via plugs to contact regions of the transistor, such as the gate electrode and S/D regions. In some embodiments, the etch stop layer may also serve as a stress layer for applying a stress on the channel of the transistor to improve performance.

The gates of the transistors are gate conductors which traverse the substrate along the Y-Z direction. As shown, a gate conductor forms two adjacent transistors. The adjacent pair of gate conductors forms two adjacent transistor pairs $125_{Y1}$ and $125_{Y2}$. The adjacent transistors along the Y-Z direction, for example, are isolated by an isolation region 190. Additional isolation regions may be provided to isolate the device regions from other device regions. The isolation regions isolate device regions of the transistor pairs. The isolation regions, for example, are shallow trench isolation (STI) regions. The STI regions are trenches filled with isolation material, such as silicon oxide. Other types of isolation regions or isolation materials may also be useful. For example, the isolation region may be a deep trench isolation (DTI) region while the isolation material may include isolation liners lining the trenches filled with isolation material and/or stress isolation material to cause a stress on a channel of the transistors to improve performance. In other embodiments, the transistors may share the same active region. Although only two transistors are shown along the X-Z and Y-Z directions, it is understood that the device may include other number of transistors in each plane.

In other embodiments, other configurations of transistors and isolation regions may also be useful. For example, adjacent conductors do not form transistor pairs along the X-Z direction. An isolation region may be provided for each gate conductor to form an active transistor and a non-active transistor. In such a case, the first S/D region is not a common S/D region for adjacent transistor. Such a configuration provides a staggered transistor configuration along the Y-Z direction. For example, an isolation region surrounds a device region for one transistor.

A dielectric layer 170 is disposed on the substrate, covering the transistors. The dielectric layer, for example, serves as an interconnect dielectric (ICD) layer. The dielectric layer, for example, is a silicon oxide layer. In one embodiment, the dielectric layer is a high aspect ratio process (HARP) dielectric material. Other types of dielectric materials are also useful. For example, the dielectric layer can be formed from doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k or ultra low-k dielectric materials such as organo-silicate glass (OSG) and fluorine-doped silicate glass (FSG). The dielectric layer should be capable of selectively etched or patterned with respect to the etch stop layer.

In one embodiment, the dielectric layer serves as a pre-metal dielectric (PMD) layer. The dielectric layer includes conductive contact plugs disposed in the dielectric layer. The contact plugs are coupled to contact regions of the transistors. For example, the contact plugs are coupled to S/D regions and gate electrodes of the transistors. Illustratively, contact plugs 160 and 162 are shown coupled to first S/D regions of the transistors. For example, the contact plugs are coupled to common S/D regions of a transistor pair. However, it is understood that contact plugs may be provided for the second S/D regions and gate electrodes of the transistors. The conductive contact plugs, for example, are tungsten (W) contact plugs. A liner may be provided to line the contact plugs. The liner, for example, may be a titanium/titanium nitride (Ti/TiN) liner. Other types of liners, for example, Ta/TaN, Ru, or WN, as well as alloys or a combination thereof may also be useful. The liner serves as an adhesion or barrier layer to prevent chemical attack during formation of the contact plugs, such as during the CVD process. Other configurations of contact plugs, such as different types of conductive materials and/or liners may also be useful.

The dielectric layer, in other embodiments, may include conductive lines coupled to contact plugs. For example, the dielectric layer may include dual damascene openings in which contact plugs and lines are formed. In the case of dual damascene openings, the conductive material is the same for the lines and contact plugs. For example, the conductive material may be copper (Cu). Other types of conductive materials may also be useful. The upper portion in which the lines are formed serves as the inter-metal dielectric (IMD) layer while the lower portion in which the contact plugs are formed serves as an intra-level dielectric (ILD) layer. The dielectric layer can be a single layer or multi-layered stack. For example, an etch stop layer can be disposed between the ILD and IMD. In a preferred embodiment, for multi-layered dielectric layers, at least the IMD layer includes a low-k or ultra low-k dielectric material.

In some embodiments, the lines and/or contacts can be provided with slanted sidewalls. The slanted sidewalls, for example, include an angle of about 85-90°. The slanted sidewalls may facilitate improved liner formation and filling. Providing conductive lines and/or contacts with non-slanted sidewalls is also useful.

A liner may be provided for the contact plugs and conductive lines. The liner, for example, may be an adhesion layer or a diffusion barrier. The liner, in one embodiment, may be a titanium/titanium-nitride (Ti/TiN) liner. Other types of liners, for example, Ta/TaN, Ru or WN, as well as alloys or a combination thereof may also be useful.

In one embodiment, a buried void 180 is located in the dielectric layer between adjacent gate conductors. The buried void may be due to pinching off of the etch stop layer between adjacent gate conductors. The void extends in the Y-Z direction. This creates a communication path between the contact plugs of adjacent transistor in the Y-Z direction. For example, the void creates a communication path between contact plugs of adjacent transistor pairs in the Y-Z direction. In one embodiment, the void is within the etch stop layer due to a small pitch size. In other embodiments, the void may extend to the dielectric layer. The void, for example, may extend from a first end to a second end of the dielectric layer.

In one embodiment, the void is filled with a dielectric filler 185, preventing shorting between contact plugs 160 and 162. The filler material, for example, includes a polymer. The polymer, for example, may be a low viscosity epoxy, polyimide, silicone, polyester, PMMA, or some commercial photoresist, ODL or NFC. Other types of dielectric filler materials may also be useful. For example, the dielectric filler can be silicate glass or flowable dielectric material, such as flowable oxide. The dielectric filler should be capable to at least partially filling the void to block the communication path between the contact plugs. By blocking the communication path, shorting between contact plugs of adjacent transistors along the Y-Z direction is prevented. In one embodiment, the dielectric filler can be selectively etched with respect to the dielectric layer 170.

FIGS. 2a-b show different cross-sectional views of another embodiment of a portion of a device 200. The cross-sectional views are simplified views of the device. The cross-sectional views are taken at orthogonal planes on the Z-axis. In one embodiment, FIG. 2a is a cross-sectional view along the X and Z axes while FIG. 2b is a cross-sectional view along the Y and Z axes. The device of FIGS. 2a-b is similar to that described in FIGS. 1a-b. As such, common elements may not be described or described in detail.

Referring to FIGS. 2a-b, adjacent transistors $120_{X1}$ and $120_{X2}$ are provided along the X-Z direction which forms a transistor pair 125. The gate conductors of the transistors traverses the substrate in the Y-Z direction of the substrate to form adjacent transistor pairs $125_{Y1}$ and $125_{Y2}$ may be separated by an isolation region 190. The adjacent transistors, in other embodiments, may also share the same active region. The gate conductors may include sidewall spacers 142 and an etch stop layer 150 may be provided to cover the transistors. A dielectric layer 170 is disposed on the substrate over the transistors. Contact plugs are disposed in the dielectric layer to contact the contact regions of the transistors. As shown, contact plugs 160 and 162 are provided to the common S/D regions 132 of the transistor pairs.

The dielectric layer includes a void 180 between the gate conductors along the Y-Z direction. The void creates a communication path between the contact plugs, for example, of adjacent transistor pairs along the Y-Z direction. The void, in one embodiment, is partially filled with a dielectric filler 285 to block the communication path between the contact plugs, leaving a partial void or air gap 287 between the contact plugs. The dielectric filler, for example, is a polymer. Other types of dielectric filler material may also be useful. The dielectric filler partially fills the void, blocking the communication path between contact plugs along the Y-Z direction. This prevents shorting of the contact plugs.

FIGS. 3a-f show cross-sectional views of an embodiment of a process for forming a device 300. The cross-sectional views are simplified views. The cross-sectional views are taken at orthogonal planes on the Z-axis. In one embodiment, figures with a subscript 1 are cross-sectional views along the X-Z plane while figures with a subscript 2 are cross-sectional views along the Y-Z plane.

Referring to FIGS. $3a_1$-$_2$, a substrate 105 is provided. The substrate, in one embodiment, is a silicon substrate. The substrate may be a doped substrate, such as a lightly p-typed doped substrates. Other types of substrates, such as a germanium-based, gallium arsenide, COI, or sapphire, may also be useful.

The substrate includes a device region. In one embodiment, the device region is prepared with first and second transistors $120_{X1}$ and $120_{X2}$ along the X-Z direction, forming a transistor pair. A device well may be provided in the substrate in the device region. The device well includes second polarity type dopants. The substrate may include other device regions for other types of devices.

A transistor includes a gate 131 with first and second S/D regions 132 and 134. The gate for example, includes a gate electrode 130 over a gate dielectric 133. The gate dielectric, for example, may be silicon oxide while the gate electrode may be polysilicon. Other types of gate dielectrics and gate electrodes may also be useful. For example, the gate dielectric may be a high k gate dielectric and the gate electrode may be a metal gate electrode. Other gate configurations of gate layers of the gate may also be useful.

The transistors, as shown, share a common S/D region 132, forming a transistor pair 125. In one embodiment, the adjacent transistors share a common first S/D region. The S/D regions are doped regions having first polarity type dopants for first-type transistors. Salicide contacts may be formed on the gate electrode of the gate and S/D regions. The salicide contacts, for example, may be nickel-based salicide contacts. Other types of metal salicide contacts may also be useful.

Sidewalls of a gate may be provided with dielectric spacers 142. The spacers may be silicon oxide spacers. Other types of spacers may also be useful. For example, the spacers may be composite spacers or formed from other type of materials. For example, the spacers may include offset spacers and main spacers. The offset spacers may facilitate forming lightly doped S/D (LDD) regions while the main spacers facilitate forming heavily doped S/D regions. In some cases, the transistor may also include halo regions. Halo regions are second polarity doped regions abutting the S/D regions proximate to the gate.

A dielectric etch stop layer 150 is formed over the transistors. The etch stop layer, for example, is a silicon nitride etch stop layer. Other types of etch stop layers may also be useful. The etch stop layer should be capable of being selectively etched with respect to a dielectric layer 170 thereover. The etch stop layer facilitates forming via plugs to contact regions of the transistor, such as the gate electrode and S/D regions. In some embodiments, the etch stop layer may also serve as a stress layer for applying a stress on the channel of the transistor to improve performance.

The gates of the transistors are gate conductors which traverse the substrate along the Y-Z direction. As shown, a gate conductor forms two adjacent transistors in the Y-Z direction. For example, the conductors form adjacent transistor pairs $125_{Y1}$ and $125_{Y2}$ in the Y-Z direction. The adjacent transistor pairs in the Y-Z direction, for example, are isolated by an isolation region 190. Additional isolation regions may be provided to isolate the device regions from other device regions. The isolation regions isolate device regions of the transistor pairs. The isolation regions, for example, are shallow trench isolation (STI) regions. The STI regions are trenches filled with isolation material, such as silicon oxide. Other types of isolation regions or isolation materials may also be useful. For example, the isolation region may be a deep trench isolation (DTI) region while the isolation material may include isolation liners lining the trenches filled with isolation material and/or stress isolation material to cause a stress on a channel of the transistors to improve performance. Although only two transistors are shown on the X-Z and Y-Z direction, it is understood that the device may include other number of transistors in each plane.

In other embodiments, other configurations of transistors and isolation regions may also be useful. For example, adjacent conductors do not form transistor pairs along the X-Z direction. An isolation region may be provided for each gate conductor to form an active transistor and a non-active transistor. In such a case, the first S/D region is not a common S/D region for adjacent transistor. Such a configuration provides a staggered transistor configuration along the Y-Z direction. For example, an isolation region surrounds a device region for one transistor.

A dielectric layer 170 is disposed on the substrate, covering the transistors. The dielectric layer, in one embodiment, serves as an ILD layer. In one embodiment, the ILD layer is a PMD layer. The thickness or height of the dielectric layer may be, for example, about from 2000 to 8000 Å or more. Providing a dielectric layer of other thicknesses may also be useful. The dielectric layer can include, for example, silicon oxide. In one embodiment, the dielectric layer includes a high aspect ratio process (HARP) dielectric material. Other types of dielectric materials are also useful. For example, the dielectric layer can include doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k or ultra low-k dielectric materials such as organosilicate glass (OSG) and fluorine-doped silicate glass (FSG).

In one embodiment, a void 180 is located between adjacent gate conductors. The void extends along the Y-Z direction. As shown, the void extends across adjacent transistor pairs $125_{Y1}$ and $125_{Y2}$. However, it is understood that the void can extend across the length of the gate conductors or may be intermittent. The void may be due to distance between gate conductors, etch stop layer requirements, process limitations or a combination thereof.

In FIGS. $3b_{1\text{-}2}$, via openings are formed in the dielectric layer. The via openings exposes contact regions below. For example, the via openings expose the contact regions of the transistors. As shown, first and second via openings 366 and 388 are formed to expose first S/D regions of the transistors. For example, the first and second via openings are formed to expose first or common S/D regions of the transistor pair. However, it is understood that via openings may also be formed to other contact regions of the transistors. For example, other contact regions may include contact regions on the gate electrode. The first and second via openings are in communication with each other as a result of the communication path created by the void.

To form the via openings, a mask (not shown) may be used. For example, a soft mask layer, such as a photoresist layer, may be formed over the dielectric layer. An exposure source may selectively expose the photoresist layer through a reticle containing the desired pattern. For example, the reticle contains the pattern of the via openings. After selectively exposing the photoresist layer, it is developed to form openings corresponding to the via openings. To improve lithographic resolution, an anti-reflective coating (ARC) may be used below the photoresist layer.

The patterned photoresist layer serves as an etch mask for a subsequent etch process to form the via openings. For example, the etch transfers the pattern of the mask to the dielectric layer. The etch, for example, may be an anisotropic etch, such as reactive ion etch (RIE). In one embodiment, an RIE is employed to form the via openings to expose the contact regions of the transistors. The RIE may be a multi-step RIE. For example, a first RIE is employed to etch the dielectric layer while a second RIE is employed to etch the etch stop layer. The RIEs may be fluorine-based RIE performed at a pressure of about 10 mT-100 mT. Forming the via openings using other etch processes may also be useful The etch processes, such as chemistry and other parameters, may be tailored for selectively removing the desired material with respect to other materials. For example, the first etch removes the dielectric layer 170 selective to the etch stop layer and the second etch removes the etch stop layer selective to the substrate.

In other embodiments, a hard mask may be used to form the via openings. The hard mask, for example, may include TEOS or silicon nitride. Other types of hard mask may also be useful. The hard mask may be patterned using a soft mask, as previously described.

In one embodiment, a wet clean is performed after forming the via openings. The wet clean, for examples, removes any possible residues or particles caused by the etch process. The wet clean, for example, may be a sulfuric peroxide mixture and SC1 clean. Other types of clean processes may also be useful.

The process continues, for example, by removing the mask formed over the dielectric layer. In one embodiment, the mask may be removed by ashing. Other techniques for removing the mask may also be useful. Referring to FIGS. $3c_{1\text{-}2}$, a dielectric filler 385 is deposited on the substrate to at least partially fill the via openings. In one embodiment, the dielectric filler is deposited on the substrate to partially fill the via openings. The via openings are sufficiently filled to block the communication path between the first and second via openings. In one embodiment, the dielectric filler fills the via openings to at least a height of the etch stop layer over the gate. Filling the via openings with the dielectric filler to other heights of the via openings may also be useful. The dielectric filler partially fills the void, leaving a gap 287 in the middle. For example the void at about the via openings are filled while a middle portion therebetween is not.

In one embodiment, the dielectric filler includes a polymer. The polymer, for example, may be a low viscosity epoxy, polyimide, silicone, polyester, PMMA, some commercial photoresist, ODL or NFC. Other types of dielectric filler materials may also be useful. For example, the dielectric filler can be silicate glass or flowable dielectric material, such as flowable oxide. The dielectric filler should be capable of at least partially filling the void to block communication between the via openings. For example, the dielectric filler may be a spin-on glass or flowable oxide. A combination of different dielectric filler materials may also be useful. Preferably, the dielectric filler material has high etch selectivity to the dielectric layer 170. For example, the dielectric filler can be removed at a high etch rate versus the dielectric layer. This enable the dielectric filler to be removed by a self-aligned etch process, which avoids the need of an etch mask. The dielectric filler material may be deposited by, for example, spin-on techniques, such as spin-on-glass or spin-on coating, sol-gel or other deposition techniques. Other techniques may also be useful, depending on the type of dielectric filler material.

The dielectric filler, in one embodiment, is cured. Curing, for example, includes exposing the dielectric filler to an elevated temperature. In one embodiment, the curing is performed at less than 500° C. The purpose for curing the dielectric filler is to densify the dielectric filler material and to cause the phase change of the dielectric filler material, such as from liquid phase to solid phase. In other embodiments, curing may not be required, depending on the type of dielectric filler material used or other processes such as CVD.

In one embodiment, the dielectric filler is removed from the via openings to expose the contact regions of the transistor, as shown in FIG. $3d_{1\text{-}2}$. For example, the dielectric filler material in the via openings are removed to expose the first S/D regions 132. An etch is employed to remove the dielectric filler material from the via openings. The etch, for example, includes a fluorine-based chemistry. Other types of etch chemistry are also useful. In one embodiment, a RIE is used to remove the dielectric filler material from the via openings. The parameters of the RIE may be selected to selectively etch the dielectric filler material vis a vis the dielectric layer 170. As discussed, this enables the etch process to be self-aligned, avoiding the need of an etch mask.

A clean process is performed after exposing the contact regions of the transistor. The clean process removes any residue or particles caused by the etch and to prepare a good surface of liner deposition. Various types of clean processes may be employed. For example, the clean process may be a wet or dry clean process, such as SC1 or SC2. The clean process should result in minimal undercut of the via opening.

In one embodiment, as shown in FIGS. $3e_{1\text{-}2}$, a conductive layer 378 is deposited on the substrate, filling the via openings and top of the dielectric layer. In one embodiment, the conductive material includes tungsten. Other types of conductive material may also be useful. For example, the conductive layer may be copper. The conductive layer may be formed by sputtering. Other techniques, such as electrolytic or electroless plating, may also be useful.

Prior to forming the conductive layer, a liner may be formed. The liner, for example, is a conductive liner which lines the walls of the via openings as well as the surface of the dielectric layer. The liner, for example, serves as a diffusion barrier. The liner, in one embodiment, may be a titanium/titanium-nitride (Ti/TiN) liner. Other types of liners, for example, tantalum, titanium nitride and ruthenium, as well as alloys or a combination thereof may also useful.

In FIGS. $3f_{1\text{-}2}$, excess material of the conductive layer and liner is removed from the surface of the dielectric layer. In one embodiment, the excess material is removed by, for example, a polishing process, such as chemical mechanical polish. Other types of polishing processes, such as electroCMP (eCMP), etch back processes or a combination thereof, including CMP, may also be useful. The polishing process removes the conductive layer and liner over the dielectric layer. This results in a planar top surface, of which top of via plugs 160 and 162 are exposed.

The process continues to complete the device. The process continues to form the IC. For example, additional processing can include forming more ICD layers and interconnections, final passivation, dicing, assembly and packaging. Other processes are also useful.

FIGS. 4*a-d* show cross-sectional views of another embodiment of a process for forming a device 400. The cross-sectional views are simplified views. The cross-sectional views are taken at orthogonal planes on the Z-axis. In one embodiment, figures with a subscript 1 are cross-sectional views along the X-Z plane while figures with a subscript 2 are cross-sectional views along the Y-Z plane.

Referring to FIGS. $4a_{1\text{-}2}$, a substrate 105 is provided. The substrate is at the processing stage as that described in FIGS. $3b_{1\text{-}2}$. Common elements of FIGS. 3*a-f* and FIGS. 4*a-d* may not be discussed or discussed in detail. The substrate, in one embodiment, is a silicon substrate. Other types of substrates may also be useful. The substrate is prepared with transistors pairs $125_{Y1}$ and $125_{Y2}$, a dielectric layer 170 and via openings 366 and 368.

As shown in FIGS. $4b_{1\text{-}2}$, a dielectric filler 485 is deposited on the substrate. The dielectric filler, in one embodiment, fills the void 180 and via openings. In one embodiment, the dielectric filler fills the void and via openings as well as covering the surface of the dielectric layer. The filler material may be cured, for example, at a temperature of less than 500° C. In other embodiments, the dielectric filler material may not be cured, depending on the types of dielectric filler material and the process used.

Referring to FIGS. $4c_{1\text{-}2}$, excess dielectric filler material on the surface of the dielectric layer and in the via opening is removed, exposing the contact regions of the transistors. For example, the dielectric filler material on the surface of the dielectric layer and in the via openings is removed to expose the common contact regions of the transistor pairs. Removal of the dielectric material over the dielectric layer and via openings leaves dielectric filler material 485 in the void. This blocks the communication path between the via openings created by the void.

In one embodiment, removal of the dielectric filler material is performed by a multi-step removal process. In one embodiment, a first etch process is performed to remove the excess filler material above the surface of the dielectric layer. The first etch process is an isotropic etch, such as a wet etch. The first etch is selective to the dielectric layer. The first etch process may remove most, all or more of the excess dielectric filler above the surface of the dielectric layer. For example, most of the dielectric filler above the surface of the dielectric material may be removed. In other embodiments, the dielectric filler above the dielectric layer is removed, exposing the dielectric layer. In yet other embodiments, the dielectric filler above the dielectric layer and some of the dielectric filler in the via openings are removed. In one embodiment, the first etch process removes the dielectric filler material up to the top of the etch stop layer above the gate. For example, the dielectric filler material should not be removed to the point of the void.

A second etch process is performed to remove the remaining dielectric filler material, exposing the contact regions of the transistors. The second etch process, in one embodiment, is an RIE. The RIE may be fluorine based RIE to remove the remaining dielectric material selective to the dielectric layer. For example, the fluorine-based chemistry may be selected to remove the dielectric filler material selective to the dielectric layer. Other processes or configurations of processes may also be useful to remove the dielectric filler material. For example, a single RIE process may be employed to remove the dielectric filler material from the surface of the dielectric layer and via openings, while leaving it in the void to block the communication path between the via openings.

Referring to FIGS. $4d_{1\text{-}2}$, the via openings are filled with a conductive material 378. The process of filling the via openings is similar to that described in FIGS. $3e_{1\text{-}2}$. The process continues as described in FIGS. $3f_{1\text{-}2}$ and onwards to complete the device.

FIGS. 5a-b show cross-sectional views of another embodiment of a process for forming a device 500. The cross-sectional views are simplified views. The cross-sectional views are taken at orthogonal planes on the Z-axis. In one embodiment, figures with a subscript 1 are cross-sectional views along the X-Z plane while figures with a subscript 2 are cross-sectional views along the Y-Z plane.

Referring to FIGS. $5a_{1\text{-}2}$, a substrate 105 is provided. The substrate is at the processing stage as that described in FIGS. $3a_{1\text{-}2}$ or prior to FIGS. $4a_{1\text{-}2}$. Common elements of the figures may not be discussed or discussed in detail. The substrate, in one embodiment, is a silicon substrate. Other types of substrates may also be useful. The substrate is prepared with transistors pairs $125_{y1}$ and $125_{y2}$ and a dielectric layer 170.

As shown in FIGS. $5b_{1\text{-}2}$, partial via openings 566 and 568 are formed. The partial via openings, for example, are formed using an etch mask (not shown) and etch process, as described in FIGS. $3b_{1\text{-}2}$ and FIGS. $4a_{1\text{-}2}$. In one embodiment, the etch process partially removes the dielectric material of the dielectric layer exposed by the mask openings to form a partial via opening without exposing the S/D regions. For contact regions on the gate electrode, it may be exposed since it is shallower than the S/D regions. The etch should remove a sufficient amount of the dielectric layer to expose the void, enabling a dielectric filler material to fill or partially fill the void to block communication between the via openings.

The etch mask, in one embodiment, may be removed thereafter. The process continues as described in, for example, FIGS. $3c_{1\text{-}2}$ or FIGS. $4b_{1\text{-}2}$ and onwards from FIGS. $4b_{1\text{-}2}$. However, when removing the dielectric filler from the via openings, a two step etch process may be employed. For example, a first step is used to remove the dielectric layer selective to the etch stop layer. This leaves some etch stop material of the etch stop layer remaining which covers the S/D contact regions of the transistors. A second etch is employed to remove the etch stop layer partially, leaving remaining portions of the etch stop layer covering the S/D regions. The second etch, for example, is an RIE. Other types of processes or process configurations may also be useful to remove the dielectric filler and to expose the S/D contact regions. For example, in other embodiments, a non-self-aligned process may be employed. In such cases, the mask can remain on top of the dielectric layer for filling the void or partial void with the dielectric filler material. An etch may be performed to remove the dielectric filler material from the via openings or partial via openings. The etch, for example, may be an anisotropic etch, such as RIE. The use of other types of etches, such as isotropic etch, may also be useful.

As described, the use of a dielectric filler to fill or partially fill the void prevents shorting of adjacent contact plugs along the direction of, for example gate conductors. This advantageously allows smaller pitch between adjacent gate conductors as well as increasing height of the gate conductors. Furthermore, etch stop layers can have more design flexibility, such as thicker etch layers. The advantages can be achieved by a self aligned process which avoids the need of additional mask layers. In addition, the advantages enable flexibility in shrinking generations of devices.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
providing a substrate prepared with first and second contact regions and a dielectric layer over the contact regions;
forming first and second transistors over the substrate, wherein each of the transistors includes a gate conductor with first and second source/drain (S/D) regions;
forming an etch stop layer over the transistors which causes a buried void to be formed in the dielectric layer;
forming first and second vias in the dielectric layer, the first via is in communication with the first contact region and the second via is in communication with the second contact region, wherein the buried void provides a communication path between the first and second vias;
at least partially filling the vias and buried void with a dielectric filler, wherein the dielectric filler fills the vias to at least a height of the etch stop layer, and wherein the partially filled buried void blocks the communication path between the first and second vias created by the buried void;
removing the dielectric filler in the vias, leaving remaining dielectric filler in the buried void to block the communication path between the first and second vias; and
forming contact plugs in the vias.

2. The method of claim 1 wherein the first and second transistors share a common S/D region.

3. The method of claim 1 wherein the buried void is located between adjacent gate conductors of the transistors.

4. The method of claim 3 wherein the buried void extends across the length of the gate conductors.

5. The method of claim 1 wherein the vias expose the first and second contact regions below the vias.

6. The method of claim 5 wherein forming the vias includes forming a patterned mask layer over the dielectric layer and etching the dielectric layer.

7. The method of claim 6 wherein the etching includes reactive ion etch.

8. The method of claim 1 wherein the buried void is completely filled with the dielectric filler.

9. The method of claim 1 wherein the dielectric filler comprises polymer.

10. The method of claim 1 wherein removing the dielectric filler in the vias includes performing an etch which etches the dielectric filler selective to the dielectric layer.

11. A method for forming a device comprising:
- providing a substrate prepared with first and second contact regions and a dielectric layer over the contact regions;
- forming first and second transistors over the substrate, wherein each of the transistors includes a gate conductor with first and second source/drain (S/D) regions;
- forming an etch stop layer over the transistors which causes a buried void to be formed in the dielectric layer;
- forming first and second vias in the dielectric layer, the first via is in communication with the first contact region and the second via is in communication with the second contact region, wherein the buried void provides a communication path between the first and second vias;
- at least partially filling the vias and buried void with a dielectric filler, wherein the dielectric filler fills the vias to at least a height of the etch stop layer; and
- removing the dielectric filler in the vias, leaving remaining dielectric filler in the buried void to block the communication path between the first and second vias.

12. The method of claim 11 wherein forming the vias includes forming a patterned mask layer over the dielectric layer and etching the dielectric layer to expose the contact regions below the vias.

13. The method of claim 12 comprising performing a clean process after forming the vias.

14. The method of claim 11 comprising curing the dielectric filler after partially filling the vias and buried void with the dielectric filler.

15. The method of claim 11 wherein the buried void at about the vias are filled with the dielectric filler while a middle portion of the buried void is not filled with the dielectric filler.

16. The method of claim 11 wherein the vias and the buried void are completely filled with the dielectric filler.

17. The method of claim 11 wherein forming the vias includes forming a patterned mask layer over the dielectric layer and etching the dielectric layer to form the vias without exposing the contact regions.

* * * * *